United States Patent [19]
Kouno et al.

[11] Patent Number: 5,317,312
[45] Date of Patent: May 31, 1994

[54] ANALOG-TO-DIGITAL CONVERTER OF AN ANNULAR CONFIGURATION

[75] Inventors: Hiroyuki Kouno; Minobu Yazawa; Toshio Kumamoto, all of Hyogo, Japan

[73] Assignee: Mitsubishi Denki Kabushiki Kaisha, Tokyo, Japan

[21] Appl. No.: 990,488

[22] Filed: Dec. 14, 1992

[30] Foreign Application Priority Data

Dec. 16, 1991 [JP] Japan .................. 3-331968

[51] Int. Cl.$^5$ .................................. H03M 1/34
[52] U.S. Cl. ........................... 341/158; 341/155
[58] Field of Search ............ 341/154, 158, 159, 161, 341/11, 13

[56] References Cited

U.S. PATENT DOCUMENTS

| | | | |
|---|---|---|---|
| 3,614,775 | 10/1971 | Brean | 341/9 |
| 4,034,363 | 7/1977 | Van Etten et al. | 341/12 |
| 4,364,029 | 12/1982 | Villa | 315/8.51 |

FOREIGN PATENT DOCUMENTS 2-214148 8/1990 Japan .

OTHER PUBLICATIONS

"An 8-bit High Speed CMOS A/D Converter", by T. Kumamoto et al., IEEE Journal of Solid–State Circuits, vol. SC-21, No. 6, Dec. 1988, pp. 976–982.

*Primary Examiner*—Brian K. Young
*Attorney, Agent, or Firm*—Lowe, Price, LeBlanc & Becker

[57] ABSTRACT

An A/D converter main body is formed in the form of an annulus with a wiring region set as its center, and a ladder resistor array for dividing an input reference voltage and an analog signal line for applying an input analog signal to each comparator in the A/D converter are formed in the form of an annulus with the wiring region set as a center. Wirings from terminals are once concentrated into the wiring region by an input/output line group and then distributed therefrom to circuit elements. Since the ladder resistor array is formed in a circular form, resistance values are less liable to change as compared to the case where the ladder resistor array is bent, resulting in a higher precision of reference voltages for comparison. Further, wiring lengths for control signals to be applied to the circuit elements are made equal, and there is no fear of line delays in the control signals.

19 Claims, 9 Drawing Sheets

ANALOG-TO-DIGITAL CONVERTER OF AN ANNULAR CONFIGURATION

BACKGROUND OF THE INVENTION

1. Field the Invention

The present invention relates to an A/D (analog-to-digital) converter including a voltage dividing network for dividing a reference voltage into a plurality of arbitrary voltage values, and a plurality of comparators for comparing divided voltage values divided by the voltage dividing network and a voltage value of an analog signal to be input.

2. Description of the Related Art

A technique for digitizing a signal for processing is playing a very significant role today with development of semiconductor devices and computers. With reference to FIG. 1, for example, a satellite broadcasting or the like is carried out as follows. First, an analog video signal is acquired by a TV camera 102, and the acquired analog video signal is then digitized by an A/D converter 104. The digitized video signal is digitally encoded for transmission by an encoder 106, then re-converted into an analog signal by a D/A converter 108 and transmitted to a broadcasting satellite 110. The analog signal repeated by the broadcasting satellite 110 is transmitted again to ground and then re-converted into a digital signal by an A/D converter 112. The digital signal is then subjected to a processing by a decoder 114 opposite to the processing by the encoder 106. The digitized video signal output from the decoder 114 is converted into an analog signal by a D/A converter 116 and then transmitted to a TV monitor 118.

In order to thus digitize the signal, it is necessary to once digitize an input signal obtained as an analog signal by the A/D converters 104 and 112.

FIG. 2 is one example of a ladder resistor array for use in an A/D converter. This ladder resistor array serves to produce a plurality of voltages called reference tap voltages which are to be compared with an input analog signal. With reference to FIG. 2, this ladder resistor array 120 includes a reference voltage terminal 124 connected to a first reference voltage, a reference voltage terminal 126 connected to a second reference voltage, and x ladder resistor cells 122a, 122b, ... , 122x connected in series between the terminals 124 and 126. Reference tap voltages 1 to x are taken out from connection points of the respective ladder resistor cells 122a, 122b, ... , 122x. These reference tap voltages 1 to x are compared at predetermined timing with a voltage value of the input analog signal. As the result of the comparison, it can be informed which range of reference tap voltage is lower than the voltage value of the input analog signal. On the basis of this information, it is possible to produce a digital signal representing the voltage value of the input analog signal.

FIG. 3 shows some of comparators and their vicinity of a background art A/D converter. This A/D converter has a resolution of N bits. In order to realize the N-bit resolution, $2^N$ comparators and $2^N$ ladder resistor cells are required.

With reference to FIG. 3, this A/D converter includes an analog signal input terminal 128 supplied with an analog signal, a reference voltage terminal 130 connected to a power source of a first reference voltage, a reference voltage terminal 132 connected to a second reference voltage power source different from the first reference voltage power source, a ladder resistor array 140 comprised of $2^N$ ladder resistor cells and disposed being bent between the reference voltage terminals 130 and 132 for resistance dividing reference voltages produced from a reference voltage 1 and a reference voltage 2, a comparator array 141 including $2^N$ comparators 142, ... , 144, provided along the bent ladder resistor array 140, for making a comparison between a voltage value of the analog signal input from the analog signal input terminal 128 and reference tap voltages generated by the ladder resistor array 140, an analog signal line 136 for applying the analog signal input from the analog signal input terminal 128 to each of the comparators included in the comparator array 141, a clock signal input terminal 134 supplied with a clock signal for controlling an operation of each comparator included in the comparator array 141 and sampling an analog signal at predetermined timing, and a clock signal line 138 for applying the clock signal applied form the clock signal input terminal 134 to each comparator of the comparator array 141.

The conventional A/D converter shown in FIG. 3 carries out the following operation. The reference voltage terminal 130 is connected to the first reference voltage power source, and the reference voltage terminal 132 is connected to the second reference voltage power source. The ladder resistor array 140 resistance-divides voltages applied to the reference voltage terminals 130 and 132 and generates $2^N$ reference tap voltages. Each of the comparators 142, ... , 144 and the like included in the comparator array 141 compares one of those reference tap voltages with the voltage value of the analog signal. The voltage value of the analog signal is converted into a digital signal on the basis of the result of the comparison by each of the comparators of the comparator array 141.

Conventionally, it has been necessary to bend a comparator array at several places (three places in the case with FIG. 3) for provision of the comparator array as shown in FIG. 3 in relation with a chip size. Accordingly, it has also been necessary to bend the ladder resistor array 140 in the same manner. Thus, there occurs a change in the resistance value of the ladder resistors due to the bending portions as compared to the case where the comparator array is aligned linearly. Consequently, errors occur in the values of reference tap voltages generated by the ladder resistor array. Further, there occurs a line delay in clock signals or the like because of wiring lengths of the signal lines. There is a large difference in the wiring length from the clock signal input terminal 134 between, e.g., the first comparator 142 and the N-th comparator 144, resulting in different timings of the clock signals to be applied. More specifically, the clock signal to be input to the comparator 144 is delayed from the clock signal to be input to the comparator 142.

FIG. 4(b) and (c), show timing charts of clock signals (control signals) PA and $\overline{PA}$ input to the comparators 142 and 144, respectively.

As shown in FIG. 4(b) and (c), a line delay $\Delta t$ occurs between the clock signals PA and $\overline{PA}$ of the comparator 142 and the clock signals PA and $\overline{PA}$ input to the comparator 144. For comparison of the same analog signal (FIG. 4(a)), the comparators 142 and 144 must compare their reference tap voltages and the voltage value of the analog signal at the same timing. Despite the necessity of the comparison, this line delay causes a deviation in the sampling timings of the comparators 142 and 144, resulting in different values of the analog signal to be sampled, as shown in FIG. 4(a). Therefore, the conventional A/D converter has the disadvantage that a precision in operation is degraded because of such errors of reference tap voltages and such delay of clock signals or the like.

SUMMARY OF THE INVENTION

The present invention has been made to eliminate the foregoing disadvantage and aims to provide an A/D converter having an improved precision in operation.

An A/D converter in accordance with the present invention includes: a semiconductor layer; a voltage dividing network having first and second end portions and formed in the form of a circular arc with a predetermined point on the semiconductor layer being set as its center, for dividing reference voltage applied to the first and second end portions and generating a plurality of voltage values on the circular arc; an analog signal transmitting line for transmitting an analog signal to a plurality of places on the semiconductor layer which are approximately the same distance apart from the central point of the voltage dividing network; a plurality of comparison circuits formed at places on the semiconductor layer which are approximately the same distance from the central point of the voltage dividing network, and connected to the analog signal transmitting line and the voltage dividing network, for comparing a voltage value of an analog signal with one of the plurality of voltage values at timing defined by a predetermined clock signal, and outputting the result of the comparison; an encoding circuit for encoding an output of each of the comparison circuits and outputting a digital signal representing the voltage value of the analog signal; and a clock signal applying circuit for applying a clock signal over approximately the same path length to each comparison circuit via the central point of the voltage dividing network.

In the above-described A/D converter, since the voltage dividing network is formed in the form of a circular arc with the predetermined point set as its center, it is unnecessary to bend the voltage dividing network, and hence, errors are liable to occur in each divided voltage value. In addition, since the clock signal is applied via the central point of the voltage dividing network over approximately the same path length to each comparison circuit, there is no deviation in the timings of comparison by the respective comparison circuits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
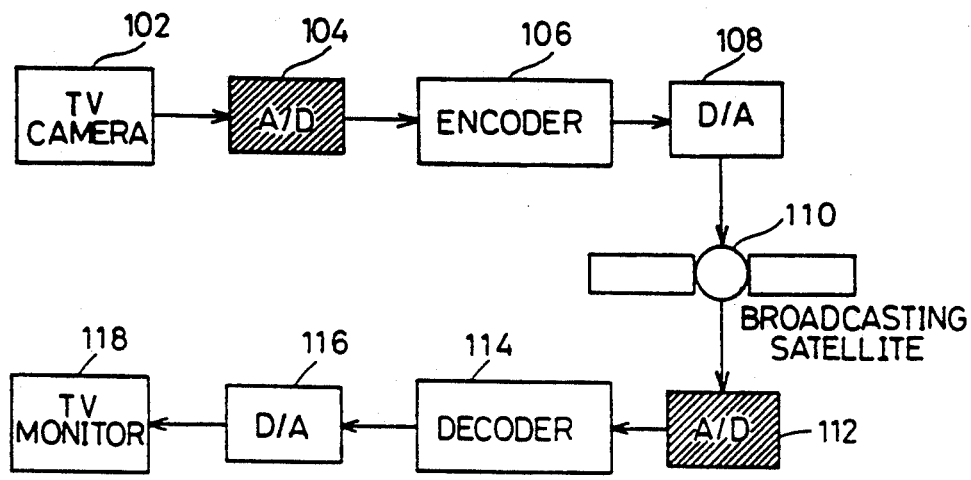
FIG. 1 is a schematic block diagram showing one example of a system employing an A/D converter.
Figure 2:
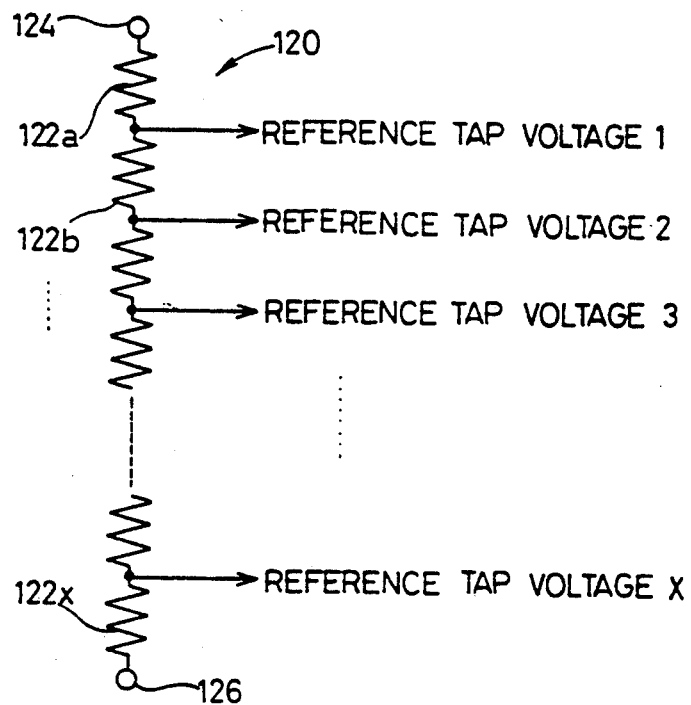
FIG. 2 is a schematic diagram showing ladder resistors being one example of a voltage dividing network.
Figure 3:
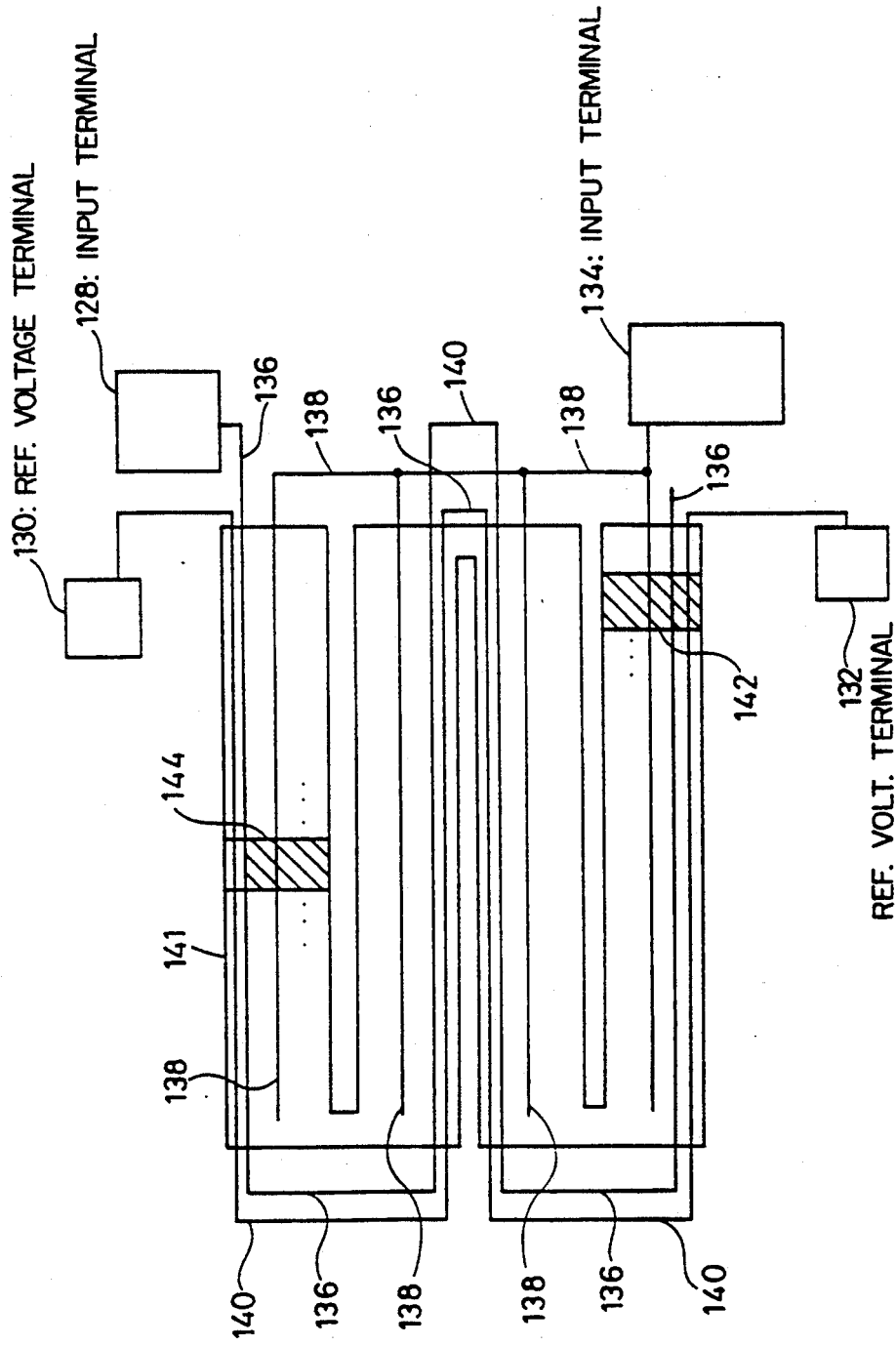
FIG. 3 is a diagram schematically showing a circuit configuration included in an A/D converter of background art.
Figure 4:
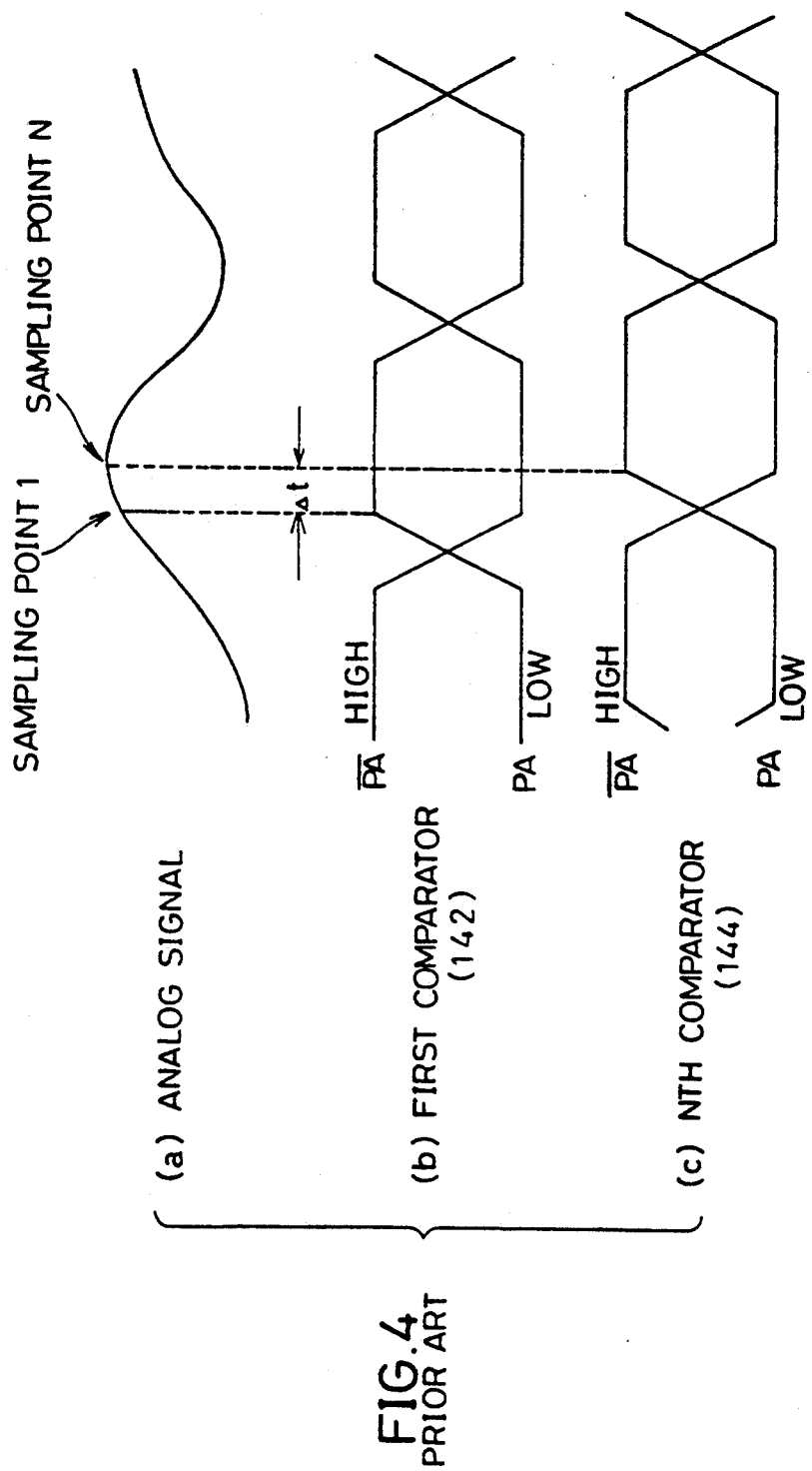
FIG. 4 is a timing chart for use in explaining an operation of the background art A/D converter.
Figure 5:
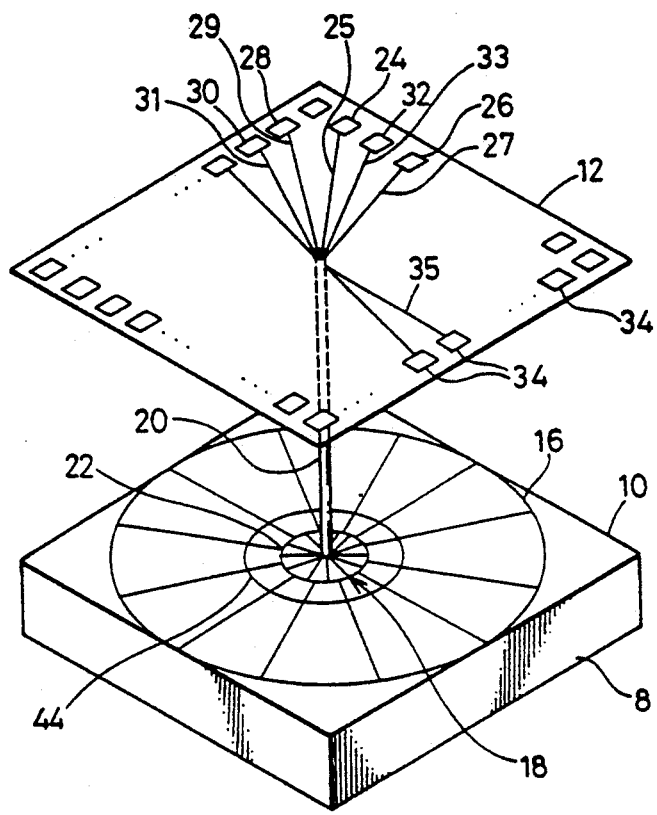
FIG. 5 is a schematic exploded perspective view of an A/D converter according to a first embodiment of the present invention.

FIG. 5 is a schematic exploded perspective view showing one example of an A/D converter in accordance with the present invention. With reference to FIG. 5, this A/D converter includes a first layer 10 formed on a semiconductor substrate 8, and a second layer 12 formed on the first layer 10 with an insulating layer not shown interposed therebetween. On peripheries of the second layer 12 is formed a terminal group including reference voltage terminals 28 and 30 connected, respectively, to a first reference voltage and a second reference voltage, control signal terminals 24 and 26 supplied with control signals PA and $\overline{PA}$, respectively, an analog signal input terminal 32 supplied with an analog signal to be digitized, and an output signal terminal 34 from which an A/D-converted output is taken out.

Figure 6:
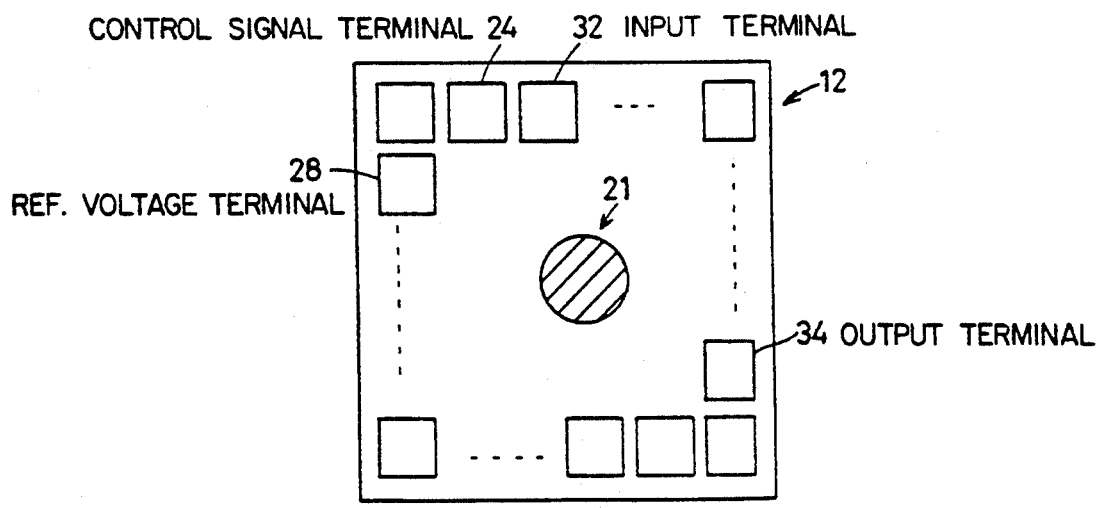
FIG. 6 is a plan view of a second layer of the A/D converter shown in FIG. 5.

With reference to FIG. 6, an input/output signal line region 21 provided with an input/output signal line group for connecting the second layer 12 and the first layer 10 vertically is formed in a central portion of the second layer 12. Control signal lines 25 and 27, reference voltage lines 29 and 31, an analog signal line 33 and an A/D output line 35 are provided from the control signal terminals 24 and 26, the reference voltage terminals 28 and 30, the analog signal input terminal 32 and the A/D output terminal 34 to the input/output line region 21. Each of the terminals 24, 26, 28, 30, 32 and 34 is connected to a predetermined portion of the first layer 10 by an input/output signal line group 20.

Figure 7:
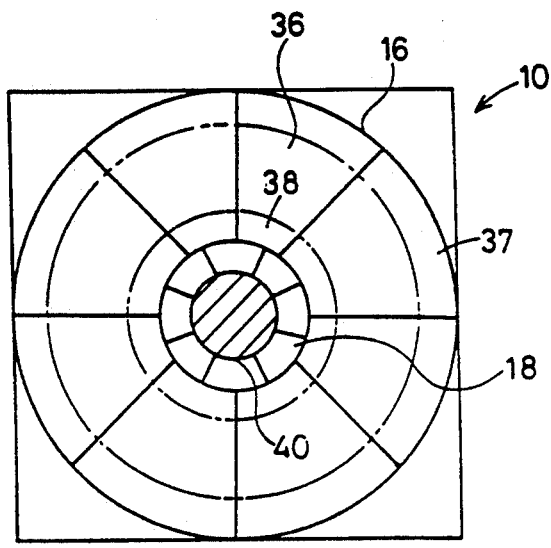
FIG. 7 is a plan view of a first layer of the A/D converter shown in FIG. 5.

With reference to FIGS. 5 and 7, an input/output signal line region 40 is formed in a region in the central portion on the first layer 10, corresponding to the input/output signal line region 21 of the first layer. The input/output signal line region 40 of the first layer and the input/output signal line region 21 of the second layer are connected by the input/output signal line group 20. A main body 16 of the A/D converter is formed in peripheries of the input/output signal line region 40.

The A/D converter main body 16 is divided into a ladder resistor region 38 in which ladder resistor cells are formed, a comparator region 36 in which comparators are formed, and an encoder region 37 in which encoders are formed, Those regions 36–38 are in the form of concentric annuluses with the input/output signal line region 40 set as its center.

An annular region 18 between the A/D converter main body 16 and the input/output signal line region 21 is a wiring region. Other necessary wirings including a control signal line 22 shown in FIG. 5 are formed in the wiring region 18. In order to facilitate the drawings, wirings other than the control signal line 22 are not shown.

Figure 8:
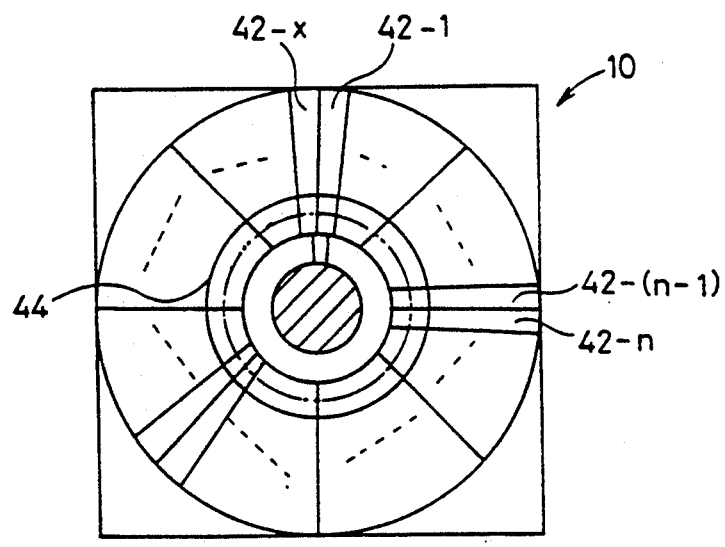
FIG. 8 is a schematic plan view showing arrangement of comparator cells on the first layer.

With reference to FIG. 8, the A/D converter main body 16 of the first layer 10 includes x ($=2^N$) comparator cells 42-1, ..., 42-(n−1), 42-n, ..., 42-x arranged annularly in peripheries of the wiring region 18. A circular input signal line 44 with the input/output signal line region 40 set as its center is formed in the A/D converter main body 16. The input signal line 44 is connected to the analog signal input terminal 32 by a wiring not shown on the first layer, and the input/output signal line group 20 and the analog signal line 33 shown in FIG. 5.

Figure 9:
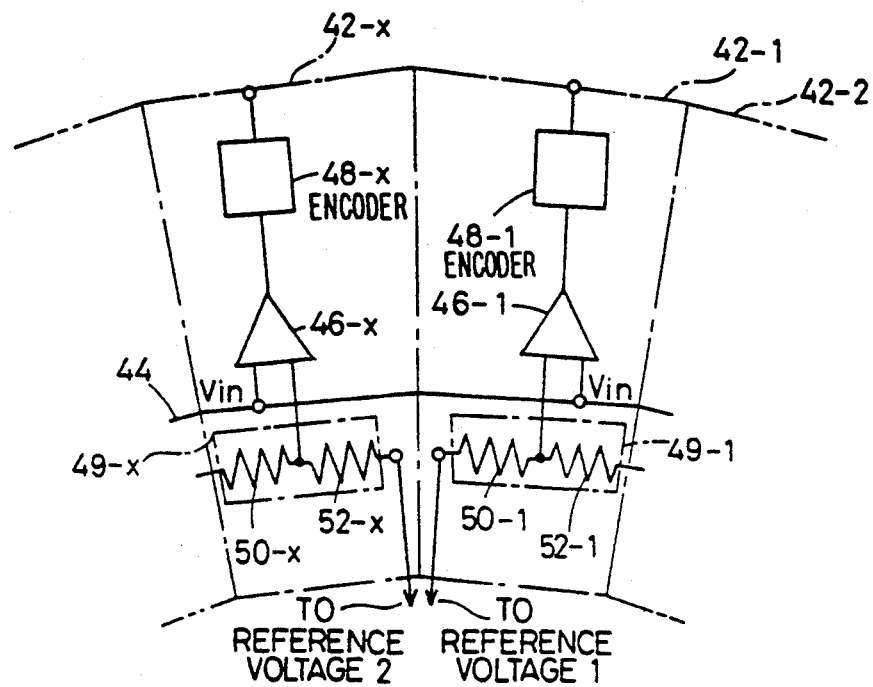
FIG. 9 is an enlarged view schematically showing a part of an A/D converter.

With reference to FIG. 9, the first comparator cell 42-1 includes a ladder resistor cell 49-1, a comparator 46-1 and an encoder 48-1.

The ladder resistor cell 49-1 includes ladder resistors 50-1 and 52-1 connected in series. One terminal of the ladder resistor 50-1 is connected to the first reference voltage terminal 28 by the wiring not shown on the first layer, and the input/output signal line group 20 and the reference voltage signal line 29 shown in FIG. 5. The ladder resistors 50-1 and 52-1 are connected in series, and the resistor 52-1 has the other terminal connected to a ladder resistor cell (not shown) included in the second comparator cell 42-2.

The comparator 46 has two inputs, one input connected to the input signal line 44, the other input connected to a contact of the ladder resistors 50-1 and 52-1. The comparator 46-1 serves to compare a reference tap voltage applied from the ladder resistor cell 49-1 with a voltage value Vin of an input analog signal applied from the input signal line 44. Then, the comparator 46-1 outputs a signal of a logic high level if the input signal Vin is larger than the reference tap voltage, while it outputs a signal of a logic low level if the input signal Vin is smaller than the reference tap voltage.

Similarly, the x-th comparator cell 42-x includes a ladder resistor cell 49-x, a comparator 46-x and an encoder 48-x. The ladder resistor cell 49-x includes ladder resistors 50-x and 52-x. One end of the ladder resistor 52-x is connected to the second reference voltage terminal 30 by the wiring not shown on the first layer 10, and the input/output signal line group 20 and the reference voltage line 31 shown in FIG. 5.

The comparator 46-1 is also connected to the control signal terminals 24 and 26 by the wiring not shown on the first layer 10, and the input/output line group 20 and the control signal lines 25 and 27 shown in FIG. 5. The comparator 46-1 operates in response to the control signals PA and $\overline{PA}$ applied, respectively, from the signal terminals 24 and 26.

Figure 10:
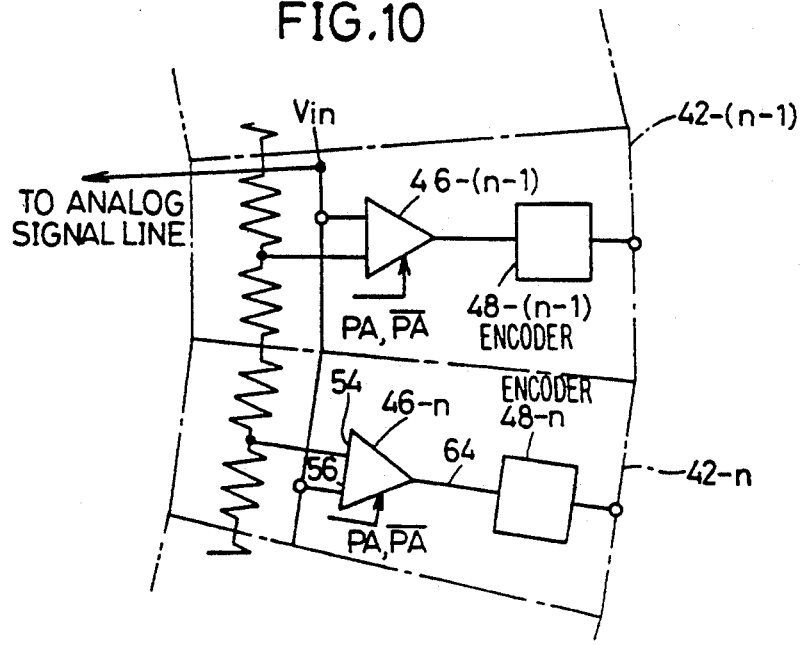
FIG. 10 is an enlarged view showing another part of a main body of the A/D converter.

With reference to FIG. 10, the (n−1)th comparator cell 42-(n−1) and the n-th comparator cell 42-n also have the same structure as that of the comparator cells 42-1 and 42-x. Each of the comparator cells 42-(n−1) and 42-n shown in FIG. 10 is different from each of the comparator cells 42-1 and 42-x shown in FIG. 9 in that opposite ends of a ladder resistor cell is connected to a ladder resistor cell of an adjacent comparator cell. In the case with this embodiment, a signal line for connecting the input signal line 44 to the analog signal input terminal 32 is formed in the (n−1)th comparator cell 42-(n−1). With respect to other points, the comparator cells 42-(n−1) and 42-n have the same structure as that of the comparator cells 42-1 and 42-x shown in FIG. 9. In both of FIGS. 9 and 10, corresponding components are denoted with corresponding reference characters. Therefore, a detailed description thereof will not be repeated here.

Figure 11:
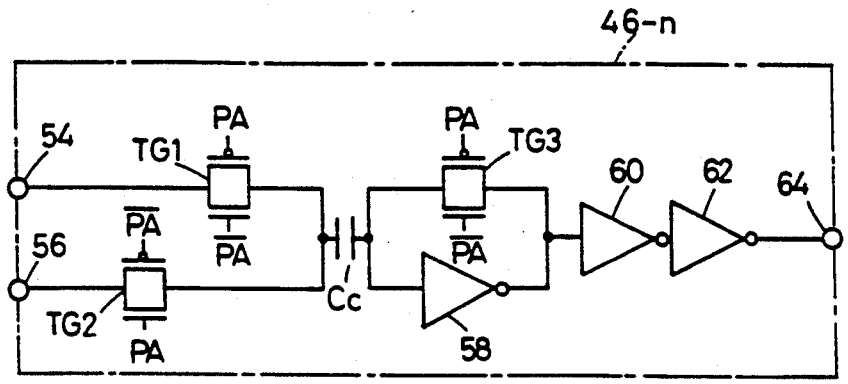
FIG. 11 is a block diagram of circuitry of a comparator.

With reference to FIG. 11, a comparator 46-n of the n-th comparator cell 42-n, for example, includes a reference signal input terminal 54 for receiving a reference tap signal generated from a ladder resistor cell, an analog signal input terminal 56 connected to the input signal line 44, a transmission gate TG1 having its input connected to the reference signal input terminal 54 and being controlled by control signals PA and $\overline{PA}$, a transmission gate TG2 having its input connected to the analog signal input terminal 56 and being controlled by reference signals $\overline{PA}$ and PA, a coupling capacitance Cc having its one plate connected to outputs of the transmission gates TG1 and TG2, a transmission gate TG3 having its input connected to the other plate of the coupling capacitance Cc and being operative in response to the control signals PA and $\overline{PA}$, an inverter 58 connected in parallel with the transmission gate TG3, an inverter 60 having its input connected to an output of the transmission gate TG3 and an output of the inverter 58, an inverter 62 having its input connected to an output of the inverter 60, and an output terminal 64 connected to an output of the inverter 62. The comparator 46-n shown in FIG. 11 is one example of a chopper type comparator.

The features of the structure of the A/D converter shown in FIGS. 5–11 are as follows. That is, as shown in FIG. 5, a wiring for connecting each terminal formed in the second layer 12 and each circuit element formed in the first layer 10 is once concentrated in the input/output signal line region 21 in the first layer 10, then reaches the first layer 10 through the input/output signal line group 20 and extends from the center of the first layer 10 to each circuit element. Corresponding circuit elements of the comparator cell 42 included in the main body of the A/D converter are disposed in regions at approximately the same distance from the input/output signal line region 40 of the first layer 10. Thus, the lengths of paths along which a control signal applied from the control signal terminal 24 reaches the respective circuit elements are made equal among the corresponding circuit elements, and no difference of line delays occurs in the applied control signals PA and $\overline{PA}$. Therefore, there is no fear that operation timing is deviated between any circuit elements. Further, the ladder resistor cells are arranged in an annular manner on the first layer 10 as shown in FIGS. 8–10. It is thus unnecessary to bend the ladder resistors, and errors are less liable to occur in the resistance values of the ladder resistors. This results in a high accuracy in the comparison made by each comparator cell.

Figure 12:
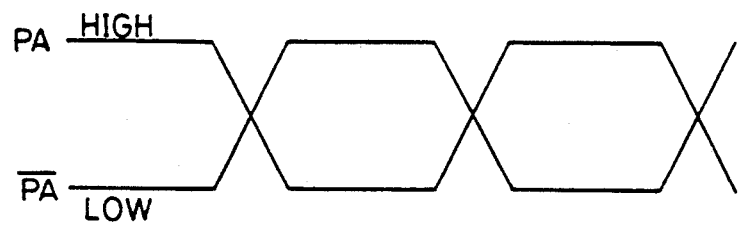
FIG. 12 is a waveform diagram of control signals.

The operation of the A/D converter shown in FIGS. 5–11 is as follows. With reference to FIG. 12, the control signal terminal 24 and the control signal terminal 26 are supplied with a control signal PA and a control signal $\overline{PA}$ which changes complementarily to the control signal PA, respectively. The control signals PA and $\overline{PA}$ are applied to each of the comparator cells 42-1 to 42-x through the respective control signal lines 25 and 27, the input/output signal line group 20 and a control signal line not shown, formed in the wiring region 18 on the first layer 10 shown in FIG. 7.

The first and second reference voltage terminals 28 and 30 are connected to power sources of the first and second reference voltages, respectively, which are different from each other. Thus, the first reference voltage is applied to one end of the ladder resistor 50-1, while the second reference voltage is applied to one end of the ladder resistor 52-x shown in FIG. 9. The ladder resistor array comprised of the ladder resistor cells 49-1 to 49-x divides voltages produced from the first and second reference voltages and produces reference tap voltages. These reference tap voltages become higher (or lower) in the order of the comparator cells 42-1 to 42-x. The analog signal input terminal 32 is supplied with an analog signal to be digitized. The analog signal is applied to the input signal line 44 as shown in FIG. 10 through the analog signal line 33, the input/output signal line group 20 and the wiring formed on the first layer 10.

The respective comparators 46-1 to 46-x included in the respective comparator cells 42-1 to 42-x compare reference tap voltages produced by the respective ladder resistor cells 49-1 to 49-x with a voltage value Vin of an analog signal at timing defined by control signals. If the voltage value Vin is higher than the respective reference tap voltages, the comparators 46-1 to 46-x output voltages of a logic high level. Conversely, if the voltage value Vin is lower than the respective reference tap voltages, the comparators output voltages of a logic low level. In response to the output voltages, the encoders 48-1 to 48-x generate digital signals.

With reference to FIG. 11, the n-th comparator 46-n, for example, carries out the following operation. The terminal 54 is supplied with a reference tap voltage generated from a corresponding ladder resistor cell. The terminal 56 is supplied with a voltage Vin of an analog signal. This chopper type comparator 46-n makes a comparison between the voltage of the analog input signal and the reference tap voltage by using the coupling capacitance Cc.

When the control signals PA and $\overline{PA}$ are at a logic low level and a logic high level, respectively, the transmission gates TG1, TG2 and TG3 are ON, OFF and ON, respectively. The reference tap voltage pass the transmission gates TG1 and TG3. The coupling capacitance Cc stores therein charges corresponding to the reference voltages.

When the control signals PA and $\overline{PA}$ attain a logic high level and a logic low level, respectively, the transmission gates TG1, TG2 and TG3 are turned off, on and off, respectively. This causes the analog signal applied from the terminal 56 to pass the transmission gate TG2, so that charges corresponding to a voltage difference between the analog input signal and the reference signal are left in the coupling capacitance Cc. The voltage value corresponding to the charges is output from the output terminal 64 via the inverter circuits 58, 60 and 62.

Figure 13:
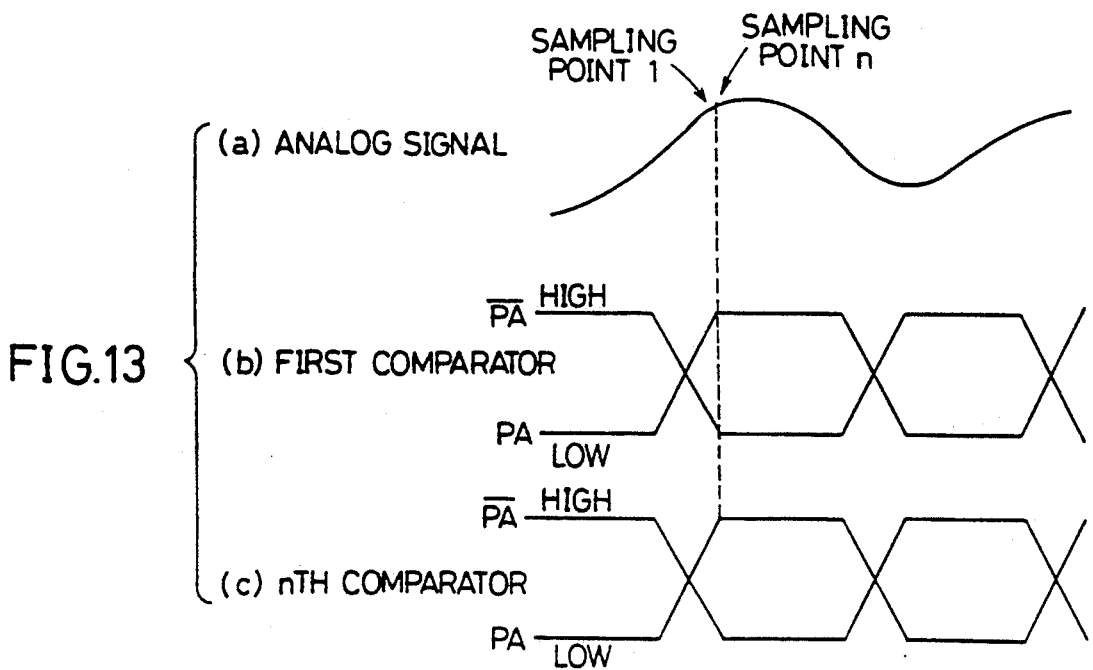
FIG. 13 is a timing chart for use in explaining an operation of the A/D converter according to the first embodiment.

With reference to FIG. 13, in the case with the A/D converter according to the present invention, the wiring lengths from the control signal terminals 24 and 26 to the comparators 46-1 to 46-X are made equal as has been already described. Thus, no line delay occurs between the control signals PA and $\overline{PA}$ applied to each comparator as shown in FIG. 13(b) and (c). Since timings of sampling defined by the control signals PA and $\overline{PA}$ are made equal in all the comparators, the voltage value of the analog signal can be sampled at the same time point as shown in FIG. 13(a). Thus, the precision of the operation of the A/D converter is increased as compared to the related art.

Further, the ladder resistor array is disposed in an annular manner as described above, and thus, the array need not be bent. Errors in the resistance values of the ladder resistors are less liable to occur, so that an accurate reference tap voltage is applied to each comparator. Accordingly, the precision of the operation of the A/D converter in accordance with the present invention is further enhanced as compared to the related art.

Figure 14:
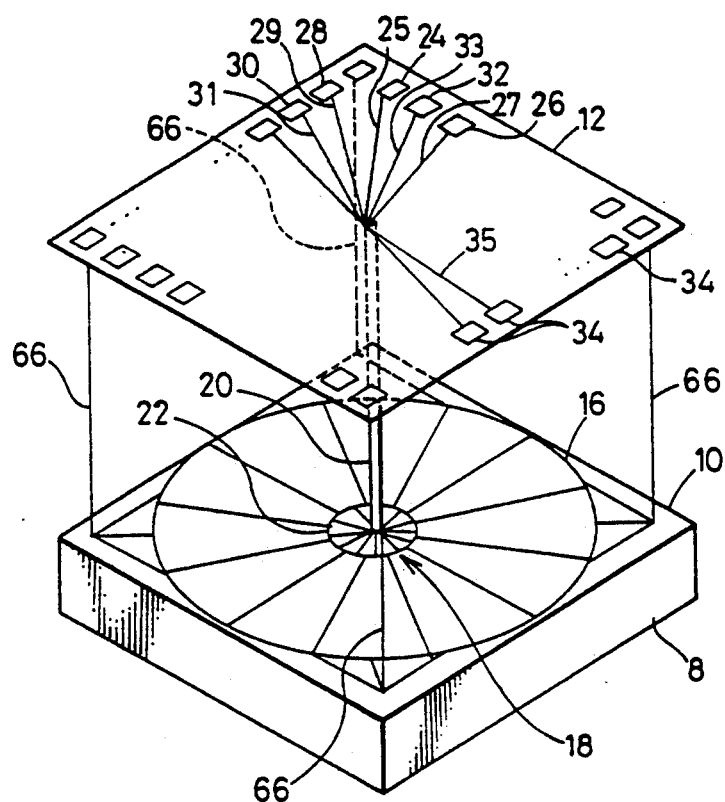
FIG. 14 is a schematic exploded perspective view of an A/D converter according to a second embodiment of the present invention.

FIG. 14 is a schematic exploded perspective view showing another embodiment of the A/D converter in accordance with the present invention. The A/D converter shown in FIG. 14 differs from the first embodiment shown in FIG. 5 in that in addition to the input/output signal line group 20 which is provided in the central portion to couple the first and second layers 10 and 12, a wiring group 66 is provided which includes wirings provided in the four corners of each of the first and second layers 10 and 12 to connect a predetermined terminal group of the first layer and a predetermined circuit element group of the second layer. In FIGS. 14 and 5, identical components are denoted with identical reference characters and names. Their functions are also identical. Therefore, a detailed description thereof will not be repeated here.

In the case with the second embodiment shown in FIG. 14, an input/output wiring group for coupling the first and second layers is provided not only in the central portion but also in the peripheries. This facilitates wiring without concentration of the wirings into the central input/output wiring group 20.

Figure 15:
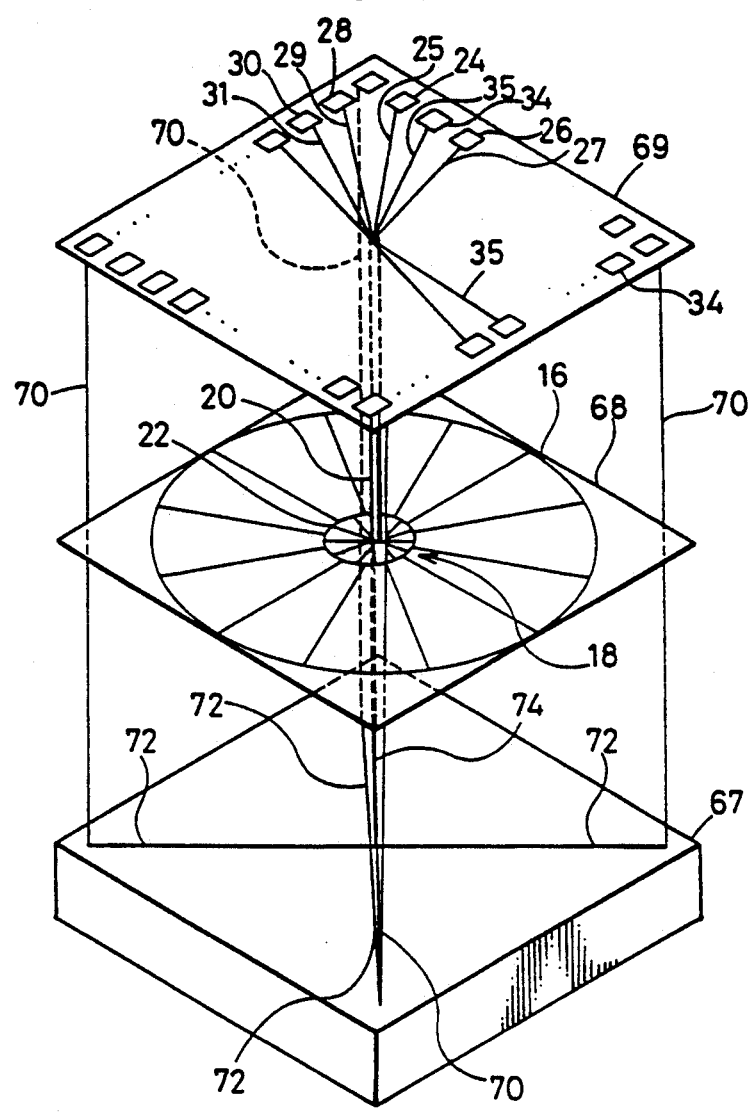
FIG. 15 is a schematic exploded perspective view of an A/D converter according to a third embodiment of the present invention.

FIG. 15 is a schematic exploded perspective view of an A/D converter according to a third embodiment of the present invention. The A/D converter shown in FIG. 15 differs from the one shown in FIG. 5 in the following point. With reference to FIG. 15, the A/D converter of the third embodiment includes a first layer 67, a second layer 68 and a third layer 69. The second layer corresponds to the first layer 10 of the A/D converter shown in FIG. 5. The third layer 69 corresponds to the second layer 12 shown in FIG. 5. Each component on the second layer 68 and the third layer 69 corresponds to each component on the first layer 10 and the second layer 12 shown in FIG. 5. In FIGS. 5 and 15, corresponding components are denoted with corresponding numbers. Their names and functions are also identical. A detailed description thereof will not thus be repeated.

The feature of the A/D converter shown in FIG. 15 is that there are provided input/output signal lines 70 for coupling the first and third layers 67 and 69, input/output signal lines 72 formed on the first layer 67 for concentrating the input/output signal lines 70 into the central portion of the first layer 67, and input/output signal lines 74 for connecting the input/output signal lines concentrated by the input/output signal lines 72 to the wiring region 18 of the second layer.

By use of such a triple-layer structure as shown in FIG. 15, each terminal of the first layer and each circuit element of the second layer are connected in an equal distance for each corresponding circuit element. This can prevent the concentration of signal lines into the input/output signal lines 20 for coupling the first and second layers. In addition, unlike the A/D converter of the second embodiment shown in FIG. 14, a line delay included in the signal applied from each terminal to each circuit element is further decreased.

Figure 16:
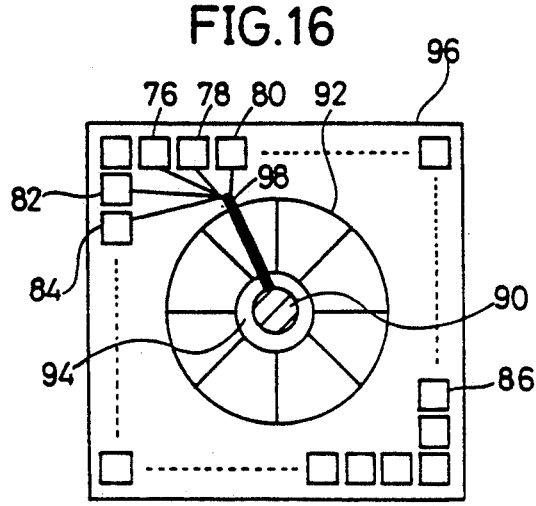
FIG. 16 is a schematic plan view of an A/D converter according to a fourth embodiment of the present invention.

All of the foregoing first to third embodiments have referred to the A/D converters implemented by a semiconductor device having a multilayer structure. However, the present invention is not limited to the semiconductor device having a multilayer structure and can be implemented also with a two-dimensional semiconductor structure. FIG. 16 is a fourth embodiment of the present invention, showing an A/D converter implemented with such a two-dimensional arrangement. With reference to FIG. 16, the A/D converter of the fourth embodiment includes a semiconductor substrate 96 constituting circuit elements, a terminal group including control signal terminals 76 and 80, an analog signal input terminal 78, reference voltage terminals 82 and 84, and an output terminal 86 which are formed in the peripheries of a surface of the semiconductor substrate 96, an input/output signal line region 90 formed in the central portion of the semiconductor substrate 96, an input/output signal line group 98 extending from each of the terminals 76, 78, 80, 82 and 84 to the input-/output signal line region 90, a wiring region 94 provided annularly in the peripheries of the input/output signal line region 90, and an A/D converter main body 92 provided annularly on further outside the wiring region 94. All of control signal lines, an analog signal input line and reference voltage lines concentrated into the input/output signal line region 90 by the input/output signal line group 98 are connected by wirings not shown to circuit elements such as comparators included in the A/D converter main body. An input signal line 88 and a ladder resistor array 100 corresponding to the input signal line 44 and the ladder resistor array 42-1 to 42-x shown in FIGS. 7 and 8 are formed in the A/D converter main body 92.

In the A/D converter according to the fourth embodiment shown in FIG. 16 also, all of control signals, reference voltage signals and an input analog signal are once concentrated into the input/output signal line region 90 and then extend therefrom to circuit elements such as comparators. Since the A/D converter main body 92 is formed in the form of an annulus with the input/output signal line region 90 set as its center, distances from the input/output signal line region 90 to their corresponding circuit elements are approximately equal. Accordingly, there is no fear that delays due to differences in wiring lengths occur in control signals or the like applied to the corresponding circuit elements. Moreover, since the ladder resistor array is formed annularly also in this embodiment, errors of reference tap voltages to be generated are decreased as compared to the case where the ladder resistor array is bent.

Therefore, a more accurate operation can be realized also in the A/D converter of the fourth embodiment shown in FIG. 16 as compared to the device of related art. In the A/D converter shown in FIG. 6, however, it is necessary to cut out a portion of a layout of the annular A/D converter main body in order to form the input/output signal line group 98. Thus, accuracy in the operation of this A/D converter is slightly deteriorated as compared to the case with use of such a three-dimensional structure as shown in the first to third embodiments.

As has been described heretofore, according to the present invention, there is no need to bend the voltage dividing network for provision. Thus, errors are less liable to occur in each divided voltage value, resulting in accurate comparisons made by individual comparator circuits. In addition, since the wiring lengths along which clock signals are applied to the comparator circuits are made equal, no deviation occurs in timings of the clock signals to be applied to the comparator circuits. Since each comparator circuit is able to compare a voltage value of an analog signal with each divided voltage value at the same timing defined by clock signals having the same timing, there is no fear that operation accuracy is degraded due to deviations of the timing of the clock signals.

Consequently, an A/D converter which is operable with high accuracy can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog-to-digital converter for converting an analog signal into a digital signal by sampling the analog signal at a timing defined by an externally applied clock signal, said converter comprising:
    a) a semiconductor layer having a main surface;
    b) a voltage dividing network having first and second end portions and formed in the form of a circular arc with a predetermined point on said main surface set as a center, for dividing a reference voltage applied to said first and second end portions to produce a plurality of divided voltage values on said circular arc;
    c) means for transmitting an analog signal to a plurality of places on said main surface which are approximately the same distance from said predetermined point;
    d) a plurality of comparison means, each formed on said main surface approximately the same distance from said predetermined point and connected to said means for transmitting said analog signal and said voltage dividing network, for comparing a voltage value of said analog signal of said plurality of divided voltage values at a timing defined by a predetermined clock signal and outputting a result of the comparison;
    e) means for encoding outputs of said comparison means to output a signal representing the voltage value of said analog signal; and
    f) means for applying said clock signal over approximately the same distance via said predetermined point to each of said plurality of said comparison means.

2. The analog-to-digital converter as recited in claim 1, wherein
    said first and second end portions are both provided in the vicinity of said predetermined point, and
    said voltage dividing network includes:
    a plurality of resistance elements being arranged on a circular arc with said predetermined point set as its center and being connected in series,
    a first connection line for connecting one end of said plurality of series-connected resistance elements to said first end portion, and a second connection line for connecting the other end of said plurality of series-connected resistance elements to said second end portion.

3. The analog-to-digital converter as recited in claim 2, wherein
said plurality of resistance elements have the same resistance value.

4. The analog-to-digital converter as recited in claim 3, wherein
said means for transmitting said analog signal includes:
an analog signal line formed in the form of a circular arc with said predetermined point set as its center, and
a third connection line having one end provided in the vicinity of said predetermined point and the other end connected to said analog signal line.

5. The analog-to-digital converter as recited in claim 4, wherein
said analog signal line forms a circle.

6. The analog-to-digital converter as recited in claim 5, wherein
said plurality of comparison means are aligned on a circular arc with said predetermined point set as its center.

7. The analog-to-digital converter as recited in claim 6, wherein
each said comparison means has
one input terminal connected to a connection point of said resistance elements, and
the other input terminal connected to said analog signal line.

8. The analog-to-digital converter as recited in claim 7, further comprising:
an upper semiconductor layer formed on and insulated from said main surface;
a plurality of input terminals formed in a surface of said upper semiconductor layer;
concentration wirings each having one end connected to one of said plurality of input terminals and the other end provided in a portion above said predetermined point on the surface of said upper semiconductor layer, for concentrating signals externally applied to said input terminals into said portion above said predetermined point; and
interlayer connecting lines for connecting said concentration wirings and portions of said first, second and third connection lines on said main surface and in the vicinity of said predetermined point.

9. The analog-to-digital converter as recited in claim 7, further comprising:
an upper semiconductor layer formed on and insulated from said main surface;
a plurality of input terminals formed in a surface of said upper semiconductor layer;
a first concentration wiring having one end connected to one of said plurality of input terminals and the other end provided in a portion above said predetermined point on the surface of said upper semiconductor layer, for concentrating signals externally applied to said input terminals into the portion above said predetermined point;
a second concentration wiring having one end connected to one of said plurality of input terminals and the other end provided in a peripheral portion of the surface of said upper semiconductor layer, for concentrating clock signals externally applied to said input terminals into said peripheral portion;

a first interlayer connecting line for connecting said first concentration wiring and said first, second and third connection lines on said main surface; and
a second interlayer connecting line for connecting said second concentration wiring and said means for applying said clock signals.

10. The analog-to-digital converter as recited in claim 7, wherein
means for applying said external signals to the vicinity of said predetermined point includes:
an upper semiconductor layer formed on and insulated from said main surface,
a lower semiconductor layer formed in a lower portion of said semiconductor layer and insulated from said semiconductor layer,
a plurality of input terminals formed in a surface of said upper semiconductor layer,
a first concentration wiring having one end connected to one of said plurality of input terminals and the other end provided in a portion above said predetermined point on the surface of said upper semiconductor layer, for concentrating signals externally applied to said input terminals into the portion above said predetermined point,
a second concentration wiring having one end connected to one of said plurality of input terminals and the other end provided in a peripheral portion of the surface of said upper semiconductor layer, for concentrating clock signals externally applied to said input terminals into said peripheral portion,
a third concentration wiring formed on a surface of said lower semiconductor layer, for concentrating signals applied to a peripheral portion of said lower semiconductor layer into a portion below said predetermined point in the surface of said lower semiconductor layer,
a first interlayer connecting line for connecting said first concentration wiring and said first, second an third connection lines on said main surface,
a second interlayer connecting line for connecting said second concentration wiring and said third concentration wiring, and
a third interlayer connecting line for connecting said third concentration wiring and said means for applying said clock signals.

11. The analog-to-digital converter as recited in claim 4, wherein
said plurality of comparison means are aligned on a circular arc with said predetermined point set as its center.

12. The analog-to-digital converter as recited in claim 11, wherein
each said comparison means has
one input terminal connected to said connection point of said resistance elements, and
the other input terminal connected to said analog signal line.

13. The analog-to-digital converter as recited in claim 12, further comprising:
a plurality of input terminals formed on a peripheral portion of said main surface; and
concentration wirings each having one end connected to one of said plurality of input terminals and the other end provided in the vicinity of said predetermined point on the surface of said upper semiconductor layer, for concentrating the signals externally applied to said input terminals into a portion in the vicinity of said predetermined point, wherein said concentration wirings and the vicinity portion of said predetermined point of said first, second and third connection lines on said main surface are connected to one another.

14. The analog-to-digital converter as recited in claim 13, wherein said analog signal line has the form of a circle having a predetermined region, and said concentration wirings are formed to pass said predefined region of said analog signal line.

15. The analog-to-digital converter as recited in claim 1, wherein said means for transmitting said analog signal includes an analog signal line formed in the form of a circular arc with said predetermined point set as its center, and a connection line having one end provided in the vicinity of said predetermined point and the other end connected to said analog signal line.

16. The analog-to-digital converter as recited in claim 15, wherein said analog signal line forms a circle.

17. The analog-to-digital converter as recited in claim 1, wherein said clock signal applying means applies said clock signal to all of said plurality of comparison means at the same time such that each of said plurality of comparison means compares the analog input signal and one said plurality of divided voltage values simultaneously.

18. An analog-to-digital converter for converting an analog signal into a digital signal by sampling the analog signal at a timing defined by an externally applied clock signal, said converter comprising:

a) a semiconductor layer having a main surface;
b) a voltage dividing network having first and second end portions and formed in the form of a circular arc with a predetermined point on said main surface set as a center, for dividing a reference voltage applied to said first and second end portions to produce a plurality of divided voltage values on said circular arc, said first and second end portions being provided in the vicinity of said predetermined point, and said voltage dividing network having
   i) a plurality of resistance elements being arranged on a circular arc with said predetermined point set as its center and being connected in series,
   ii) a first connection line for connecting one end of said plurality of series-connected resistance elements to said first end portion, and
   iii) a second connection line for connecting the other end of said plurality of series-connected resistance elements to said second end portion;
c) means for transmitting an analog signal to a plurality of places on said main surface which are approximately the same distance from said predetermined point;
d) a plurality of comparison means, each formed on said main surface approximately the same distance from said predetermined point and connected to said means for transmitting said analog signal and said voltage dividing network, for comparing a voltage value of said analog signal of said plurality of divided voltage values at a timing defined by a predetermined clock signal and outputting a result of the comparison;
e) means for encoding outputs of said comparison means to output a signal representing the voltage value of said analog signal; and
f) means for applying said clock signal over approximately the same distance via said predetermined point to each of said plurality of said comparison means.

19. An analog-to-digital converter for converting an analog signal into a digital signal by sampling the analog signal at a timing defined by an externally applied clock signal, said converter comprising:

a) a semiconductor layer having a main surface;
b) a voltage dividing network having first and second end portions and formed in the form of a circular arc with a predetermined point on said main surface set as a center, for dividing a reference voltage applied to said first and second end portions to produce a plurality of divided voltage values on said circular arc;
c) means for transmitting an analog signal to a plurality of places on said main surface which are approximately the same distance from said predetermined point, said means for transmitting said analog signal having
   i) an analog signal line formed in the form of a circular arc with said predetermined point set as its center, and
   ii) a connection line having one end provided in the vicinity of said predetermined point and the other end connected to said analog signal line;
d) a plurality of comparison means, each formed on said main surface approximately the same distance from said predetermined point and connected to said means for transmitting said analog signal and said voltage dividing network, for comparing a voltage value of said analog signal of said plurality of divided voltage values at a timing defined by a predetermined clock signal and outputting a result of the comparison;
e) means for encoding outputs of said comparison means to output a signal representing the voltage value of said analog signal; and
f) means for applying said clock signal over approximately the same distance via said predetermined point to each of said plurality of said comparison means.

* * * * *